(12) United States Patent
Nakanishi

(10) Patent No.: US 8,654,539 B2
(45) Date of Patent: Feb. 18, 2014

(54) CAPACITOR-INCORPORATED SUBSTRATE AND COMPONENT-INCORPORATED WIRING SUBSTRATE

(75) Inventor: Naoya Nakanishi, Komaki (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 109 days.

(21) Appl. No.: 13/389,364

(22) PCT Filed: Aug. 4, 2010

(86) PCT No.: PCT/JP2010/063208
§ 371 (c)(1),
(2), (4) Date: Feb. 7, 2012

(87) PCT Pub. No.: WO2011/074283
PCT Pub. Date: Jun. 23, 2011

(65) Prior Publication Data
US 2012/0241906 A1    Sep. 27, 2012

(30) Foreign Application Priority Data
Dec. 15, 2009   (JP) ................................ 2009-284608

(51) Int. Cl.
*H05K 1/18*   (2006.01)
*H01L 21/02*  (2006.01)

(52) U.S. Cl.
USPC ............................. 361/763; 361/761; 257/532

(58) Field of Classification Search
USPC .................. 361/760–767; 257/532, 528, 499; 174/257, 260
See application file for complete search history.

(56) References Cited

U.S. PATENT DOCUMENTS

| | | | |
|---|---|---|---|
| 6,370,013 | B1 | 4/2002 | Iino et al. |
| 7,525,175 | B2* | 4/2009 | Kariya ........................... 257/532 |
| 2005/0088833 | A1* | 4/2005 | Kikuchi et al. ............... 361/763 |
| 2007/0076392 | A1* | 4/2007 | Urashima et al. ............ 361/763 |
| 2007/0263364 | A1 | 11/2007 | Kawabe et al. |
| 2008/0258262 | A1* | 10/2008 | Nagai ........................... 257/535 |
| 2008/0277150 | A1* | 11/2008 | Takashima et al. ........... 174/260 |
| 2009/0139760 | A1* | 6/2009 | Tanaka ........................... 174/264 |
| 2009/0237900 | A1* | 9/2009 | Origuchi et al. ............... 361/763 |
| 2010/0084175 | A1* | 4/2010 | Suzuki et al. .................. 174/260 |

FOREIGN PATENT DOCUMENTS

| | | |
|---|---|---|
| JP | 11-163529 A | 6/1999 |
| JP | 2000-223799 A | 8/2000 |
| JP | 2001-339163 A | 7/2001 |

(Continued)

OTHER PUBLICATIONS

ISA/JP, International Search Report for international application PCT/JP2010/063208, mailed Oct. 26, 2010.

*Primary Examiner* — Hoa C Nguyen
*Assistant Examiner* — Ahmad D Barnes
(74) *Attorney, Agent, or Firm* — Stites & Harbison PLLC; Jeffrey A. Haeberlin

(57) ABSTRACT

An object of the present invention is to provide a capacitor-incorporated wiring substrate in which connection reliability can be improved through ensuring of a path for supply of electric potential even upon occurrence of a faulty connection in a via-conductor group. In a capacitor-incorporated wiring substrate of the present invention, a capacitor 50 is accommodated in a core 11, and a first and a second buildup layers 12 and 13 are formed on the upper and lower sides, respectively, of the capacitor 50.

11 Claims, 12 Drawing Sheets

(56) References Cited

FOREIGN PATENT DOCUMENTS

| | | |
|---|---|---|
| JP | 2001-244368 A | 9/2001 |
| JP | 2001-339008 A | 12/2001 |
| JP | 2007-318089 A | 12/2007 |
| JP | 2009-147177 A | 7/2009 |

* cited by examiner

CAPACITOR-INCORPORATED SUBSTRATE AND COMPONENT-INCORPORATED WIRING SUBSTRATE

TECHNICAL FIELD

The present invention relates to a capacitor-incorporated wiring substrate in which a capacitor is accommodated in an accommodation portion of a core.

BACKGROUND ART

Conventionally, there has been used a wiring substrate in which a core is disposed at the center thereof and in which conductor layers and insulation layers are laminated alternatingly on the upper surface and on the lower surface of the core, thereby forming respective buildup layers. In the case where a package is formed through mounting of a semiconductor device on such a wiring substrate, in order to stabilize a power-supply voltage to be supplied to the semiconductor device from an external board and to reduce noise, disposition of a capacitor on the package for connection to power-supply lines is desirable. In this case, in order to reduce the wiring distance between the capacitor and the semiconductor device, a wiring substrate in which a capacitor is incorporated is proposed. Such a capacitor-incorporated wiring substrate employs, for example, the following structure: the wiring substrate has an accommodation portion, and a via-array-type capacitor having a plurality of via conductors arranged in an array is accommodated in the accommodation portion (refer to, for example, Patent Document 1).

Generally, in the via-array-type capacitor, via conductors connected to positive-side internal electrode layers and via conductors connected to negative-side internal electrode layers are arranged alternatingly. Thus, it is necessary to form two kinds of electrode patterns on an electrode layer formed on each of the front and back surfaces of the capacitor, for connection to two kinds of via conductors respectively corresponding to the positive side and the negative side. The surface electrode layer of this type of capacitor has, for example, a planar structure shown in FIG. 15. In FIG. 15, there are arranged a plurality of via conductors Va to be connected to the ground, which is on the negative side, and a plurality of via conductors Vb to be connected to a power-supply voltage, which is on the positive side. A negative-side electrode pattern Pa is in the form of a solid pattern and is connected unitarily to the upper ends of a plurality of the via conductors Va, whereas a positive-side electrode pattern Pb is in the form of a plurality of independent constituent patterns connected to the respective upper ends of a plurality of the via conductors Vb. A multilayer laminate portion of the wiring substrate is provided on the surface electrode layer of FIG. 15. In the laminate portion, conductor layers which are patterned in a manner similar to that of the surface electrode layer are laminated. A semiconductor chip, for example, is mounted on the laminate portion. The via conductors Va and Vb are electrically connected to respective pads of the semiconductor chip via a via-conductor group extending through the laminate portion disposed thereabove.

PRIOR ART DOCUMENTS

Patent Documents

Patent Document 1: Japanese Patent Application Laid-Open (kokai) No. 2007-318089

Patent Document 2: Japanese Patent Application Laid-Open (kokai) No. 2009-147177

SUMMARY OF THE INVENTION

Problems to be Solved by the Invention

In the above-mentioned conventional wiring substrate, a power-supply voltage and the ground potential are supplied to the semiconductor chip via paths which include via conductors connected in multiple levels in the direction of lamination. However, such a structure potentially involves the occurrence of a faulty connection caused by cracking in a via conductor. For example, even when a faulty connection arises in a single via conductor Va, the supply of the ground potential is not hindered, since the electrode pattern Pa is in the form of a solid pattern. By contrast, when a faulty connection arises in a single via conductor Vb, the supply of the power-supply voltage along a path which includes a via conductor(s) located above the position of the faulty connection is hindered, resulting in a potential failure to supply the power-supply voltage to an associated pad of the semiconductor chip. Even when the power-supply voltage can be supplied along another path, an increase in inductance associated with the occurrence of a faulty connection in the via conductor Vb cannot be avoided. In this case, in order to ensure a sufficiently large pattern area for the ground potential, it is undesirable for the electrode pattern Pb connected to the power-supply voltage to assume a solid form, which has a large area.

The present invention has been conceived to solve the above problems, and an object of the invention is to provide a capacitor-incorporated wiring substrate in which, while an increase in inductance is avoided, connection reliability can be improved through implementation of a structure which can ensure a path for supply of electric potential even when a faulty connection arises in a via-conductor group extending between a capacitor and a laminate portion in the direction of lamination.

Means for Solving the Problems

To achieve the above object, the present invention provides a capacitor-incorporated wiring substrate which has a core having an accommodation portion in the form of a recess or a through hole, a capacitor having dielectric layers and electrode layers laminated alternatingly, and accommodated in the core, and a laminate portion formed on at least an upper surface of the core and having insulation layers and conductor layers laminated alternatingly. The capacitor-incorporated wiring substrate is characterized by comprising a first via-conductor group to be electrically connected to a first electric potential, and adapted to connect, in a direction of lamination, the electrode layers and the conductor layers; a second via-conductor group to be electrically connected to a second electric potential, and adapted to connect, in the direction of lamination, the electrode layers and the conductor layers; a first electrode pattern formed in a front-surface electrode layer on a front surface of the capacitor and electrically connected to the first via-conductor group; a plurality of second electrode patterns formed in the front-surface electrode layer and connected to respective columns of via conductors of the second via-conductor group; a first conductor pattern formed in a proximate conductor layer of the laminate portion disposed in proximity to and facing the capacitor, and electrically connected to the first via-conductor group; and a plurality of second conductor patterns formed in the proximate conductor layer and connected to respective columns of via conductors of the second via-conductor group. Also, the capacitor-incorporated wiring substrate is characterized in that each of the second electrode patterns connects a predetermined number of capacitor-side via conductors arranged in a first direction and that each of the second conductor patterns connects a predetermined number of laminate-portion-side via conductors arranged in a second direction intersecting with the first direction.

According to the capacitor-incorporated wiring substrate of the present invention, the first electrode pattern connected to the first via-conductor group, and a plurality of the second electrode patterns connected to the second via-conductor group, are formed in the front-surface electrode layer of the capacitor accommodated in the accommodation portion of the core. Also, the first conductor pattern connected to the first via-conductor group, and a plurality of the second conductor patterns connected to the second via-conductor group, are formed in the proximate conductor layer of the laminate portion on the upper surface of the core. Thus, for connection to the first electric potential, paths which include the first via-conductor group, the first electrode pattern, and the first conductor pattern are established. For connection to the second electric potential, paths which include the second via-conductor group, the second electrode patterns, and the second conductor patterns are established. Furthermore, a plurality of the second electrode patterns of the front-surface electrode layer of the capacitor and a plurality of the second conductor patterns of the proximate conductor layer of the laminate portion are formed in the following webbing relation: each of the second electrode patterns connects a predetermined number of via conductors arranged in one direction, and each of the second conductor patterns connects a predetermined number of via conductors arranged in another direction orthogonal to the one direction. Accordingly, diversified paths exist for supplying the second electric potential via the second electrode patterns and the second conductor patterns. Therefore, even when a faulty connection caused by cracking arises in the second via-conductor group, a path for supplying the second electric potential is reliably ensured, so that connection reliability can be improved without involvement of an increase in inductance.

In the present invention, no particular limitation is imposed on the arrangement of a plurality of via conductors including those of the first via-conductor group and the second via-conductor group. For example, the via conductors can be arranged in a grid array or in a staggered array with respect to planar directions. Also, each of the second conductor patterns can connect, for example, a predetermined number of laminate-portion-side via conductors arranged in a second direction orthogonal to the above-mentioned first direction.

In the present invention, the first electric potential can be the ground potential, and the second electric potential can be a power-supply voltage. Also, the laminate portion may include a conductor layer formed in the same pattern as that of the front-surface electrode layer, and a conductor layer formed in the same pattern as that of the proximate conductor layer, the conductor layers being laminated alternatingly above the proximate conductor layer. Also, the plurality of the second electrode patterns and the plurality of the second conductor patterns may be patterns of the same elongated rectangular shape arranged in parallel with each other at intervals of the same distance. Also, the first electrode pattern may be formed in a solid form in the front-surface electrode layer with a predetermined clearance existing between the first electrode pattern and the plurality of the second electrode patterns, and the first conductor pattern may be formed in a solid form in the proximate conductor layer with a predetermined clearance existing between the first conductor pattern and the plurality of the second conductor patterns. Also, a semiconductor device greater in planar size than the capacitor may be mounted on the laminate portion. In this case, desirably, a group of terminals to be connected to the first electric potential and a group of terminals to be connected to the second electric potential are formed on a back surface of the semiconductor device within a region which, as viewed in the direction of lamination, is superimposed on the capacitor.

To achieve the above object, the present invention provides another mode of a capacitor-incorporated wiring substrate having the core and the laminate portion. The capacitor-incorporated wiring substrate is characterized by comprising the first via-conductor group; the second via-conductor group; the first electrode pattern; a plurality of second electrode patterns formed in the front-surface electrode layer and connected to respective subgroups of via conductors of the second via-conductor group, the subgroups each consisting of two or more via conductors; a plurality of first conductor patterns formed in a first conductor layer of the laminate portion disposed in proximity to and facing the capacitor, and electrically connected to respective via conductors of the first via-conductor group; a second conductor pattern formed in the first conductor layer and electrically connected to the second via-conductor group; a third conductor pattern formed in a second conductor layer located above the first conductor layer, and electrically connected to the first via-conductor group; and a plurality of fourth conductor patterns formed in the second conductor layer and electrically connected to respective via conductors of the second via-conductor group. Also, the capacitor-incorporated wiring substrate is characterized in that each of the second electrode patterns connects a predetermined number of capacitor-side via conductors.

According to the above mode of the capacitor-incorporated wiring substrate of the present invention, the first electrode pattern and the second electrode patterns, which are surface electrodes of the capacitor, are formed as mentioned above; a plurality of the first conductor patterns and the second conductor pattern are formed in the first conductor layer, which serves as a proximate conductor layer; and the third conductor pattern and a plurality of the fourth conductor patterns are formed in the second conductor layer, which is located above the first conductor layer. For connection to the first electric potential, paths which include the first via-conductor group, the first electrode pattern, a plurality of the first conductor patterns, and the third conductor pattern are established. For connection to the second electric potential, paths which include the second via-conductor group, the second electrode patterns, the second conductor pattern, and a plurality of the fourth conductor patterns are established. Thus, with attention being focused on a certain via conductor of the capacitor, even when a faulty connection arises in a via extending through the wiring laminate portion, a path for supply of electric potential can be reliably ensured, so that connection reliability can be improved.

In the above-mentioned mode, no particular limitation is imposed on the structures of the second conductor pattern and the third conductor pattern. However, for example, the second conductor pattern may be formed in a solid form with a predetermined clearance existing between the second conductor pattern and the plurality of the first conductor patterns, and the third conductor pattern may be formed in a solid form with a predetermined clearance existing between the third conductor pattern and the plurality of the fourth conductor patterns. By virtue of this, a shield effect can be ensured for both of the first electric potential and the second electric potential.

Furthermore, the present invention can be applied widely to component-incorporated wiring substrates in which a component is accommodated in the core, in addition to capacitor-incorporated substrates. The component-incorporated wiring substrate of the present invention can also yield actions and effects similar to those yielded by the above-mentioned capacitor-incorporated substrate.

Effects of the Invention

According to the present invention, in the capacitor-incorporated wiring substrate, a plurality of the second electrode patterns of the front-surface electrode layer of the capacitor and a plurality of the second conductor patterns of the proximate conductor layer of the laminate portion are formed in such a webbing manner that each of the second electrode patterns connects a predetermined number of via conductors arranged in one direction, whereas each of the second conductor patterns connects a predetermined number of via conductors arranged in another direction orthogonal to the one direction, whereby the second electric potential can be supplied via the second via-conductor group connected to both of the second electrode patterns and the second conductor patterns. Thus, for supply of the second electric potential, there exist diversified paths based on the arrangement of the second electrode patterns and the second conductor patterns. Accordingly, even when a faulty connection caused by cracking in a certain via conductor or the like arises, supply of the second electric potential is not hindered, whereby connection reliability can be improved. Also, an increase in inductance associated with a faulty connection caused by cracking in a via conductor or a like cause can be effectively prevented.

MODES FOR CARRYING OUT THE INVENTION

Two embodiments of a wiring substrate to which the present invention is applied will next be described as preferred embodiments of the present invention. However, the embodiments to be described below are examples of application of the technical concept of the present invention. The contents of the embodiments should not be construed as limiting the invention.

(First Embodiment)

Figure 1:
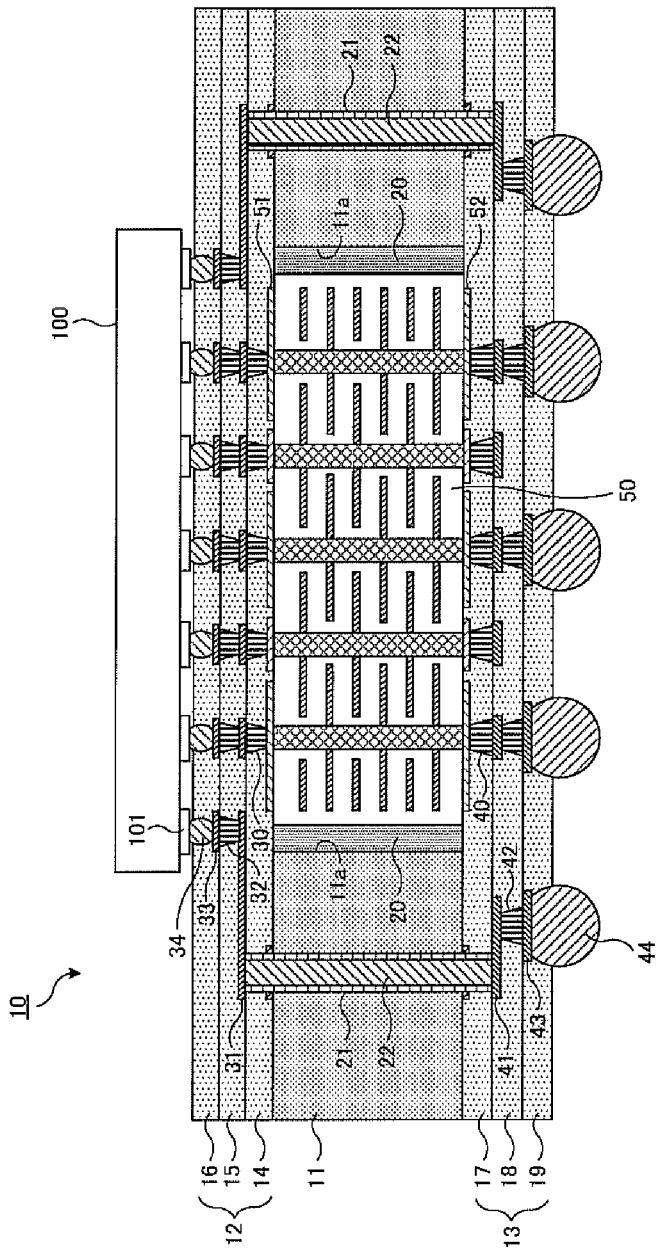
[FIG. 1] View showing the sectional structure of a wiring substrate of a first embodiment.

FIG. 1 shows the schematic sectional structure of a wiring substrate of a first embodiment. A capacitor-incorporated wiring substrate 10 (hereinafter, referred to merely as the wiring substrate 10) shown in FIG. 1 has a structure which includes a core 11, a first buildup layer 12 (laminate portion) formed on the upper surface of the core 11, and a second buildup layer 13 (laminate portion) formed on the lower surface of the core 11. The wiring substrate 10 of the first embodiment has a capacitor 50, which is a chip component, incorporated therein, and a semiconductor chip 100, which is a semiconductor device, mounted thereon.

The core 11 is formed from, for example, an epoxy resin which contains glass fiber. The core 11 has a rectangular accommodation hole 11a extending therethrough and formed in a central region thereof. The capacitor 50 is accommodated in the accommodation hole 11a in an embedded manner. A clearance between the wall surface of the accommodation hole 11a and the side surface of the capacitor 50 is filled with a resin filler 20. In the first embodiment, the capacitor 50 is a via-array-type capacitor which establishes a predetermined capacitance between the positive side and the negative side. The capacitor 50 is electrically connected to the first buildup layer 12 via a front-surface electrode layer 51 formed on the front surface thereof, and to the second buildup layer 13 via a back-surface electrode layer 52 formed on the back surface thereof. The specific structure of the capacitor 50 will be described later. The resin filler 20 is formed from, for example, a thermosetting resin and absorbs a deformation of the capacitor 50 relative to the core 11.

The first buildup layer 12 has a structure in which a resin insulation layer 14 on the core 11, a resin insulation layer 15 on the resin insulation layer 14, and a solder resist layer 16 on the resin insulation layer 15 are laminated together. A conductor layer 31 is formed on the upper surface of the resin insulation layer 14. A plurality of terminal pads 33 are formed on the upper surface of the resin insulation layer 15. A plurality of via conductors 30 are provided in the resin insulation layer 14 at predetermined positions and conductively connect the front-surface electrode layer 51 of the capacitor 50 and the conductor layer 31 in the direction of lamination. A plurality of via conductors 32 are provided in the resin insulation layer 15 at predetermined positions and conductively connect the conductor layer 31 and a plurality of the terminal pads 33 in the direction of lamination. The solder resist layer 16 has a plurality of openings where a plurality of the terminal pads 33 are exposed, and a plurality of solder bumps 34 are formed in the respective openings. The solder bumps 34 are connected to respective pads 101 of the semiconductor chip 100 to be mounted on the wiring substrate 10.

The second buildup layer 13 has a structure in which a resin insulation layer 17 under the core 11, a resin insulation layer 18 under the resin insulation layer 17, and a solder resist layer 19 under the resin insulation layer 18 are laminated together. A conductor layer 41 is formed on the lower surface of the resin insulation layer 17. A plurality of BGA pads 43 are formed on the lower surface of the resin insulation layer 18. A plurality of via conductors 40 are provided in the resin insulation layer 17 at predetermined positions and conductively connect the back-surface electrode layer 52 of the capacitor 50 and the conductor layer 41 in the direction of lamination. A plurality of via conductors 42 are provided in the resin insulation layer 18 at predetermined positions and conductively connect the conductor layer 41 and a plurality of the BGA pads 43 in the direction of lamination. The solder resist layer 19 has a plurality of openings where a plurality of the BGA pads 43 are exposed, and a plurality of solder balls 44 are connected to the respective exposed BGA pads 43. In the case where the wiring substrate 10 is used as a BGA package, electrical connection can be established between an unillustrated external substrate and constituent elements of the wiring substrate 10 via a plurality of the solder balls 44.

Also, the core 11 has a plurality of through-hole conductors 21 extending therethrough in a peripheral region in the direction of lamination. The interiors of the through-hole conductors 21 are filled with blocking bodies 22 formed from, for example, glass epoxy. The through-hole conductors 21 and the blocking bodies 22 extend up to the conductor layer 31 through the resin insulation layer 14 of the first buildup layer 12 and up to the conductor layer 41 through the resin insulation layer 17 of the second buildup layer 13. Thus, the upper conductor layer 31 and the lower conductor layer 41 are conductively connected at predetermined positions in the direction of lamination by means of the through-hole conductors 21.

Figure 2:
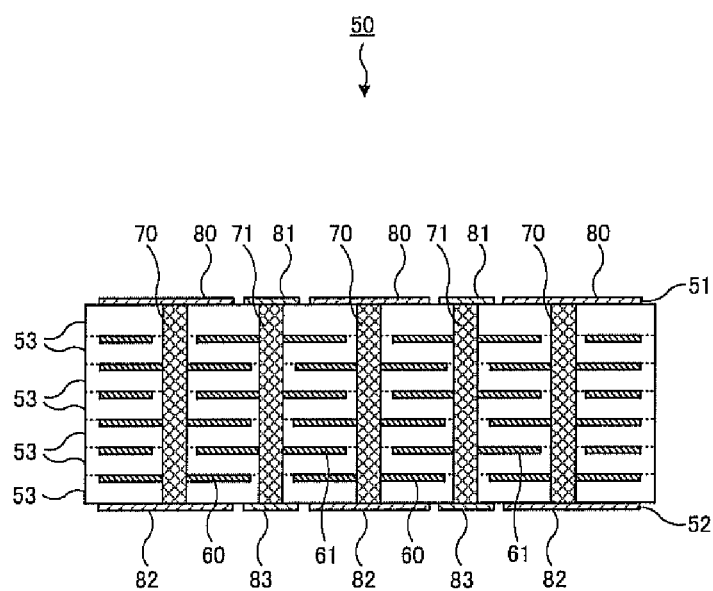
[FIG. 2] Sectional structural view of a capacitor 50.

Next, the structure of the capacitor 50 shown in FIG. 1 will be described with reference to FIGS. 2 and 3. FIG. 2 shows the sectional structure of the capacitor 50. The capacitor 50 of the first embodiment is formed from a ceramic sintered body of a high-dielectric-constant ceramic, such as barium titanate, and has a structure in which a plurality of ceramic dielectric layers 53 are laminated together. As shown in FIG. 2, internal electrode layers 60 and internal electrode layers 61 are formed alternatingly between the ceramic dielectric layers 53. The internal electrode layers 60 function as negative electrodes, whereas the internal electrode layers 61 function as positive electrodes. The positive and negative electrodes face each other with the ceramic dielectric layers 53 intervening therebetween, thereby establishing a predetermined capacitance.

The capacitor 50 has a large number of via holes extending through all of the ceramic dielectric layers 53 in the direction of lamination, and the via holes are filled with nickel or the like, thereby forming a plurality of via conductors 70 and 71. The via conductors 70 collectively function as a negative-side first via-conductor group; the via conductors 71 collectively function as a positive-side second via-conductor group; and the two types of the via conductors 70 and 71 are arranged alternatingly. The negative-side via conductors 70 are connected to the internal electrode layers 60, and the positive-side via conductors 71 are connected to the internal electrode layers 61.

A first electrode pattern 80 and a second electrode pattern 81 are formed in the front-surface electrode layer 51 on the front surface of the capacitor 50. The negative-side first electrode pattern 80 is electrically connected to the upper ends of a plurality of the via conductors 70. The positive-side second electrode pattern 81 is electrically connected to the upper ends of a plurality of the via conductors 71. Meanwhile, a first electrode pattern 82 and second electrode patterns 83 are formed in the back-surface electrode layer 52 on the back surface of the capacitor 50. The negative-side first electrode pattern 82 is electrically connected to the lower ends of a plurality of the via conductors 70. The positive-side second electrode patterns 83 are electrically connected to the respective lower ends of a plurality of the via conductors 71.

The first embodiment assumes that a power-supply voltage and the ground potential are connected to the semiconductor chip 100 such that the power-supply voltage (second potential) is connected to the positive side of the capacitor 50, whereas the ground potential (first potential) is connected to the negative side of the capacitor 50. Accordingly, on the upper side of the capacitor 50, by way of the solder bumps 34, the terminal pads 33, the via conductors 32, the conductor layer 31, and the via conductors 30 shown in FIG. 1, the pads 101 of the semiconductor chip 100 for connection to the ground potential and the first electrode pattern 80 are electrically connected together, and the pads 101 of the semiconductor chip 100 for connection to the power-supply voltage and the second electrode pattern 81 are electrically connected together. Similarly, on the lower side of the capacitor 50, by way of the via conductors 40, the conductor layer 41, the via conductors 42, the BGA pads 43, and the solder balls 44, which are shown in FIG. 1, the first electrode pattern 82 and the terminals of an external substrate for connection to the ground potential are electrically connected together, and the second electrode patterns 83 and the terminals of the external substrate for connection to the power-supply voltage are electrically connected together.

Figure 3:
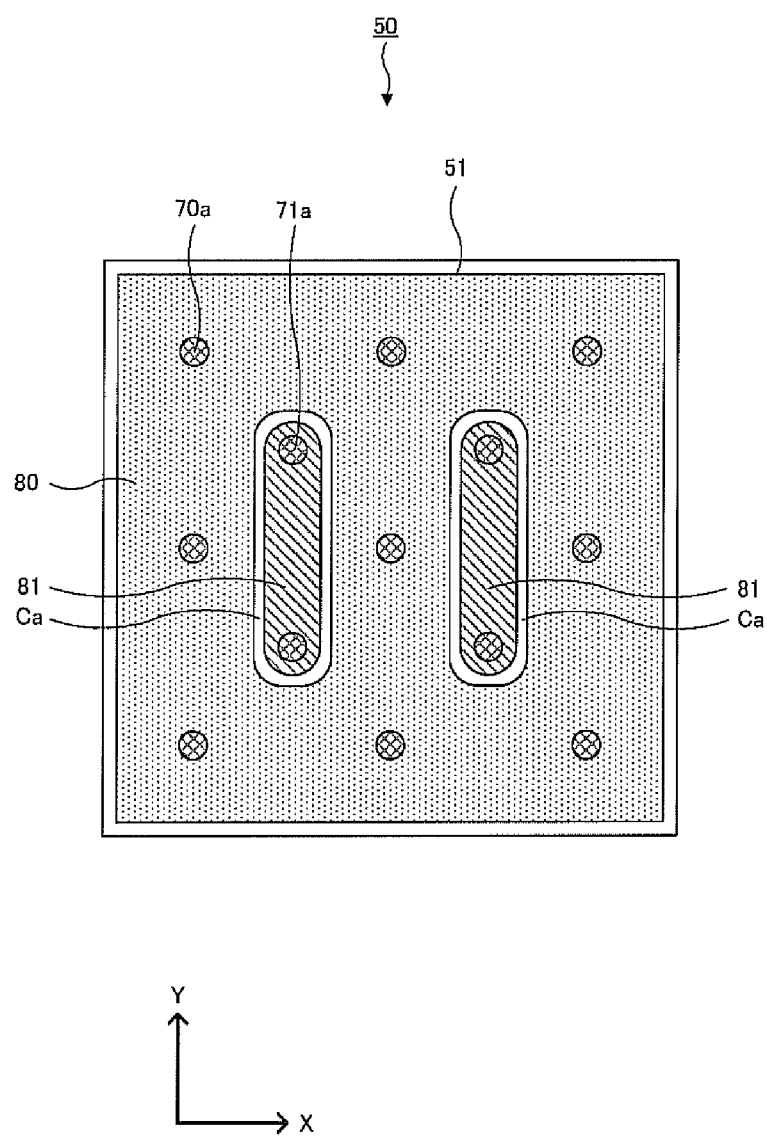
[FIG. 3] View showing an example of the planar structure of a front-surface electrode layer 51 of the capacitor 50.

Next, FIG. 3 shows an example of the planar structure of the front-surface electrode layer 51 of the capacitor 50. As mentioned above, the front-surface electrode layer 51 has the first electrode pattern 80 to be connected to the ground potential, and the second electrode pattern 81 to be connected to the power supply voltage. For convenience sake, the X direction and the Y direction are indicated at a lower portion of FIG. 3. The front-surface electrode layer 51 has a substantially square region surrounded by sides in parallel with the X direction and sides in parallel with the Y direction. The first electrode pattern 80 is in the form of a solid pattern extending almost over the entire front-surface electrode layer 51 and surrounds the second electrode pattern 81. The second electrode pattern 81 is in the form of two columnar patterns extending in the Y direction.

As shown in FIG. 3, 13 via conductors 70 and 71 are arranged in a staggered array immediately under the front-surface electrode layer 51. The first electrode pattern 80 is connected to upper ends 70a of the nine via conductors 70. The electrode pattern 81 is connected to upper ends 71a of the four via conductors 71. Each columnar pattern of the second electrode pattern 81 connects the upper ends 71a of two via conductors 71 arranged in the Y direction. The two columnar patterns which constitute the second electrode pattern 81 have the same elongated rectangular shape and are arranged in parallel with and away from each other. In the front-surface electrode layer 51, the first electrode pattern 80 and the second electrode pattern 81 are insulated from each other by means of a predetermined clearance Ca therebetween.

In FIG. 3, nine (3×3) via conductors 70 and four (2×2) via conductors 71 are arranged. However, this arrangement is a mere example. Even when a greater number of the via conductors 70 and 71 are arranged, a structure similar to that described above can be implemented. For example, 16 (4×4) via conductors 70 and nine (3×3) via conductors 71 may be arranged. In this case, the second electrode pattern 81 is in the form of three columnar patterns, each of which connect the upper ends 71a of three via conductors 71 arranged in the Y direction. In generalization, even when M via conductors 71 are arranged in the X direction, and N via conductors 71 are arranged in the Y direction, the second electrode patter 81 can be in the form of, for example, M columnar patterns, each of which connects the upper ends 71a of N via conductors 71.

Figure 4:
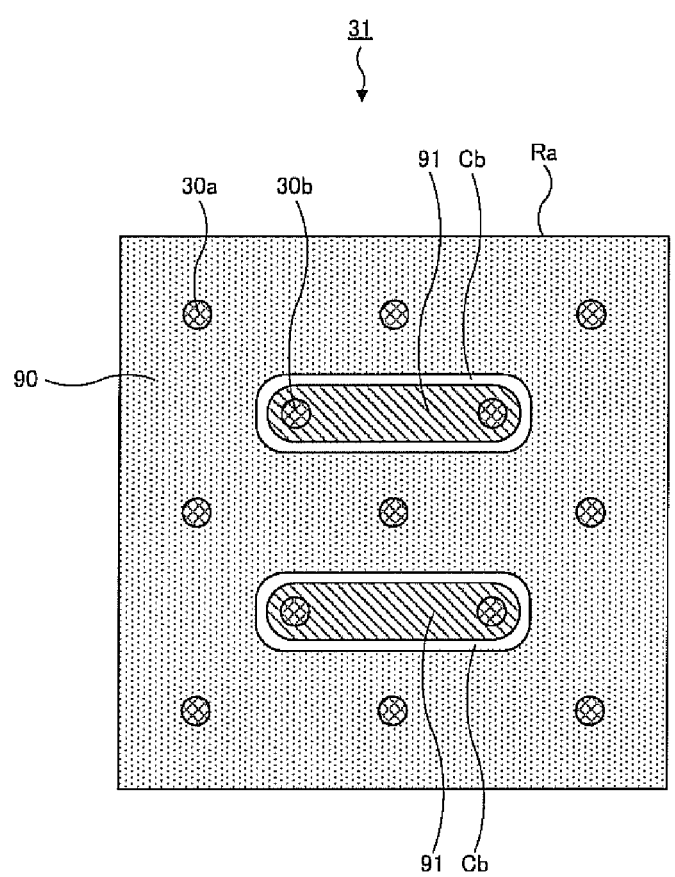
[FIG. 4] View showing an example of the planar structure of a region Ra of a conductor layer 31 of a first buildup layer 12, the region Ra facing the front-surface electrode layer 51 of the capacitor 50 with respect to the direction of lamination.

Next will be described the planar structure of the conductor layer 31 (proximate conductor layer) of the first buildup layer 12 shown in FIG. 1, the conductor layer 31 being in proximity to the capacitor 50. FIG. 4 shows an example of the planar structure of a region Ra of the conductor layer 31, the region Ra being in proximity to and facing the front-surface electrode layer 51 of the capacitor 50 with respect to the direction of lamination. A first conductor pattern 90 to be connected to the ground potential, and a second conductor pattern 91 to be connected to the power-supply voltage, are formed in the region Ra of the conductor layer 31. Similar to the case of FIG. 3, the region Ra is a substantially square region surrounded by sides in parallel with the X direction and sides in parallel with the Y direction, the X and Y directions being indicated at a lower portion of FIG. 4. The first conductor pattern 90 is in the form of a solid pattern extending almost over the entire conductor layer 31 and surrounds the second conductor pattern 91. The second conductor pattern 91 is in the form of two columnar patterns extending in the X direction.

As shown in FIG. 4, 13 via conductors 30 immediately under the conductor layer 31 are arranged in a staggered array at positions, in an XY plane, identical with those of the 13 via conductors 70 and 71 of the capacitor 50. The first conductor pattern 90 is connected to upper ends 30a of nine via conductors 30 extending upward above the respective via conductors 70 to be connected to the ground potential. The second conductor pattern 91 is connected to upper ends 30b of four via conductors 30 extending upward above the four respective via conductors 71 to be connected to the power-supply voltage. Each columnar pattern of the second conductor pattern 91 connects the upper ends 30b of two via conductors 30 arranged in the X direction. The two columnar patterns which constitute the second conductor pattern 91 have the same elongated rectangular shape and are arranged in parallel with and away from each other. In the region Ra of the conductor layer 31, the first electrode pattern 90 and the second conductor pattern 91 are insulated from each other by means of a predetermined clearance Cb therebetween.

A difference in arrangement between the second electrode pattern 81 of FIG. 3 and the second conductor pattern 91 of FIG. 4 is described below. In FIG. 3 showing the electrode layer of the capacitor 50, the via conductors 71 corresponding to the columnar patterns of the second electrode pattern 81 are arranged in the Y direction. By contrast, in FIG. 4 showing the conductor layer 31, the via conductors 30 corresponding to the columnar patterns of the second conductor pattern 91 are arranged in the X direction. In other words, the second electrode pattern 81 of the capacitor 50 and the second conductor pattern 91 of the conductor layer 31 of the first buildup layer 12 are in such a relation that the columnar patterns of the second electrode pattern 81 and the columnar patterns of the second conductor patter 91 face each other in the vertical direction and extend in respective directions orthogonal to each other. The first embodiment employs the pattern arrangements shown in FIGS. 3 and 4, thereby yielding the effect of improving connection reliability of electric-potential supply paths between the capacitor 50 and the semiconductor chip 100.

Figure 5:
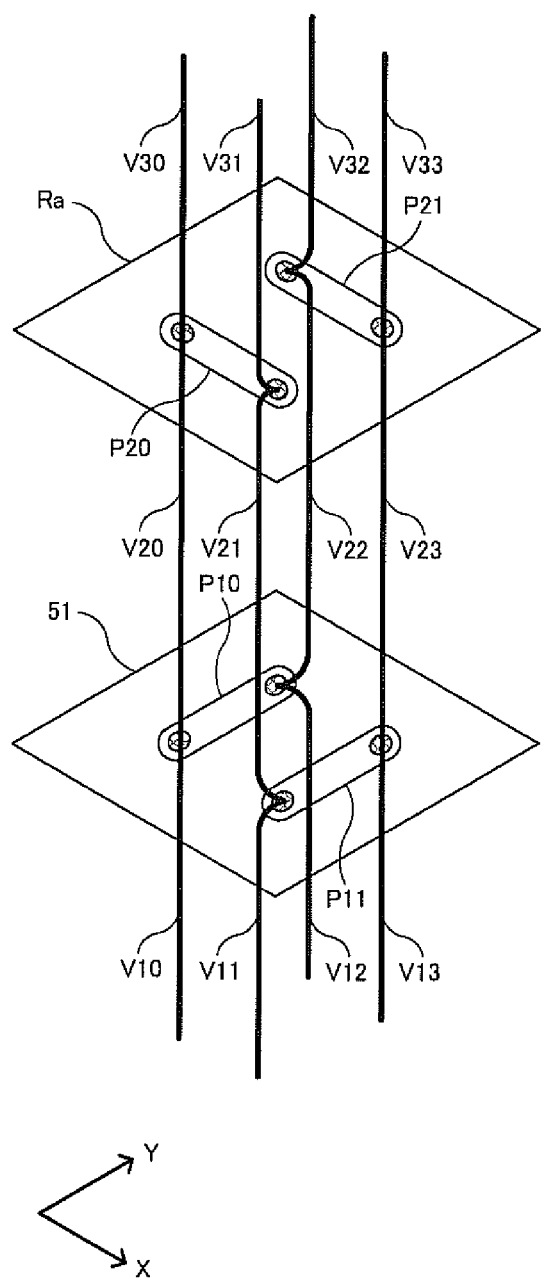
[FIG. 5] View for explaining specific effects of the first embodiment.

Next, specific effects of the first embodiment are described below with reference to FIG. 5. FIG. 5 is a perspective view schematically showing the relation between the second electrode pattern 81 of FIG. 3 and the second conductor pattern 91 of FIG. 4. FIG. 5 schematically shows, in a state in which the front-surface electrode layer 51 of the lower capacitor 50 and the region Ra of the upper conductor layer 31 face each other, the arrangements of electrode patterns P10 and P11 corresponding to the columnar patterns of the second electrode pattern 81; conductor patterns P20 and P21 corresponding to the columnar patterns of the second conductor pattern 91; via conductors V10, V11, V12, and V13 corresponding to the via conductors 71 under the electrode patterns P10 and P11; via conductors V20, V21, V22, and V23 corresponding to the via conductors 30 between the electrode patterns P10 and P11 and the conductor patterns P20 and P21; and via conductors V30, V31, V32, and V33 corresponding to the via conductors 32 above the conductor patterns P20 and P21. The first electrode pattern 80 and the first conductor pattern 90 to be connected to the ground, and the clearances Ca and Cb, are omitted in FIG. 5.

In FIG. 5, when attention is focused on, for example, the upper via conductor V30, the via conductor V30 is connected to the following paths: a path extending to the via conductor V10 by way of the via conductor V20; a path extending to the via conductor V11 by way of the conductor pattern P20 and the via conductor V21; a path extending to the via conductor V12 by way of the via conductor V20 and the electrode pattern P10; and a path extending to the via conductor V13 by way of the conductor pattern P20, the via conductor V21, and the electrode pattern P11. That is, the via conductor V30 is electrically connected to the four via conductors V10 to V13 of the capacitor 50 through diversified paths. Similar to the via conductor V30, the upper via conductors V31, V32, and V33 are also electrically connected to the four via conductors V10 to V13 of the capacitor 50. Thus, for example, even when a faulty connection arises in any one of the intermediate via conductors V20 to V23, electrical connection can be maintained between the upper via conductors V30 to V33 and the lower via conductors V10 to V13.

Figure 15:
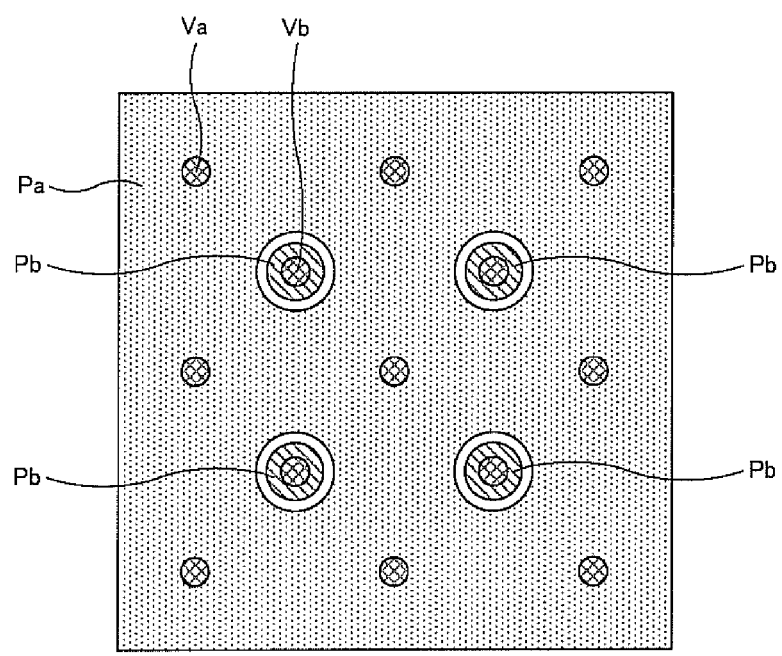
[FIG. 15] View showing the planar structure of a front-surface electrode layer in a conventional capacitor-incorporated wiring substrate.

By contrast, suppose that the electrode patterns P10 and P11 and the conductor patterns P20 and P21, each of which connects two via conductors together, are not formed. For example, let's assume a structure in which the via conductors V10, V20, and V30 of FIG. 5 are connected together only in the direction of lamination and are not electrically connected to a group of other via conductors (see, for example, FIG. 15). In this case, diversified paths as shown in FIG. 5 do not exist. Thus, when a faulty connection arises in, for example, the via conductor V20, electrical connection fails to be maintained between the upper via conductor V30 and the lower via conductor V10. Alternatively, suppose that the electrode patterns P10 and P11 and the conductor patterns P20 and P21 are of the same pattern (for example, all of the patterns extend in the Y direction). In this case also, diversified paths as shown in FIG. 5 do not exist. Specifically, for example, via conductors of two systems connected to the common electrode pattern and to the common conductor pattern are connected to one another, but are not connected to via conductors of the other two systems. Thus, this structure is inferior in connection reliability to the structure of FIG. 5. Furthermore, the employment of the structure of FIG. 5, in which diversified paths exist, yields the effect of enabling an associated reduction in inductance.

The above description with reference to FIGS. 3 to 5 has discussed only the relation between the planar structure of the front-surface electrode layer 51 of the capacitor 50 and the planar structure of the conductor layer 31, which is the proximate conductor layer, of the first buildup layer 12. In this connection, in the case where the first buildup layer 12 assumes a further-multilayered configuration, desirably, constituent conductor layers alternatingly have, from the bottom conductor layer, the planar structure of FIG. 3 and the planar structure of FIG. 4. Specifically, in the case of the first buildup layer 12 having N conductor layers, the bottom conductor layer is the proximate conductor layer having the planar structure of FIG. 4, and the upper conductor layers are such that the even-numberth conductor layer from the bottom conductor layer has the planar structure of FIG. 3, whereas the odd-numberth conductor layer from the bottom conductor layer has the planar structure of FIG. 4. In the conductor layers, a region which faces the front-surface electrode layer 51 as viewed in the direction of lamination has the planar structure of FIG. 3 or FIG. 4. Through employment of such a structure, the wiring substrate 10 can exhibit further improved connection reliability between the capacitor 50 and the semiconductor chip 100. As for the back-surface electrode layer 52 of the capacitor 50 and the second buildup layer 13, their importance is not high, since they do not directly face the semiconductor chip 100. However, the back-surface electrode layer 52 and the second buildup layer 13 may have planar structures similar to those described above of the front-surface electrode layer 51 and the first buildup layer 12, respectively.

Figure 6:
[FIG. 6] First sectional structural view for explaining a method of manufacturing the wiring substrate of the first embodiment.

Next, a method of manufacturing the wiring substrate 10 of the first embodiment will be described with reference to FIGS. 6 to 11. First, as shown in FIG. 6, the core 11 having the accommodation hole 11a is fabricated. For fabrication of the core 11, for example, a base material having a square planar shape, 400 mm on a side, and a thickness of 0.80 mm is used. A through hole which will become the accommodation hole 11a is cut in the core 11 at a predetermined position by use of a router. If necessary, the core 11 may be formed of a copper-clad laminate having copper foil affixed to opposite sides. The core 11 shown in FIG. 6 has the accommodation hole 11a in the form of a through hole extending therethrough. However, the core 11 may have an accommodation portion in the form of a recess formed at an upper portion thereof.

Meanwhile, the capacitor 50 having the structure shown in FIG. 2 is fabricated for preparation. In fabrication of the capacitor 50, a nickel paste is screen-printed onto ceramic green sheets which will become the ceramic dielectric layers 53, followed by drying, thereby forming internal electrode layers 60 and 61. The ceramic green sheets on which the respective internal electrode layers 60 are formed, and the ceramic green sheets on which the respective internal electrode layers 61 are formed, are alternatingly laminated together. To the resultant assembly, a pressing force is applied in the direction of lamination for uniting the green sheets together, thereby forming a laminate. Subsequently, a plurality of via holes are formed in the laminate in such a manner as to extend through the laminate by use of a laser beam machine. A nickel paste is charged into the via holes, thereby forming the via conductors 70 and 71. A paste is applied by printing onto the upper surface of the laminate, thereby forming a metallization layer which will become the first electrode pattern 80 and the second electrode pattern 81 of the front-surface electrode layer 51. Also, the paste is applied by printing onto the lower surface of the laminate, thereby forming a metallization layer which will become the first electrode pattern 82 and the second electrode pattern 83 of the back-surface electrode layer 52. Next, the laminate is dried and then debindered, followed by firing at a predetermined temperature for a predetermined time. As a result, barium titanate, and nickel contained in the paste, are cofired, thereby yielding a ceramic sintered body. Copper electroplating is performed on the front-surface electrode layer 51 and the back-surface electrode layer 52 formed on the upper and lower sides of the ceramic sintered body so as to form respective copper plating layers, each having a thickness of about 10 µm, thereby completing the capacitor 50.

Figure 7:
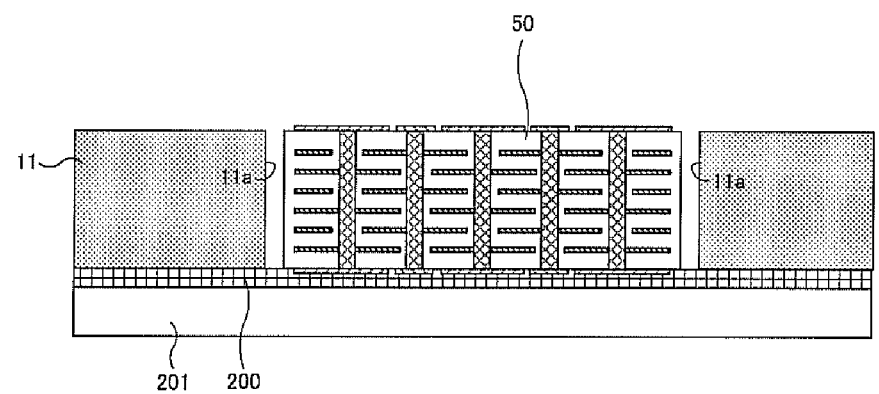
[FIG. 7] Second sectional structural view for explaining the method of manufacturing the wiring substrate of the first embodiment.
Figure 8:
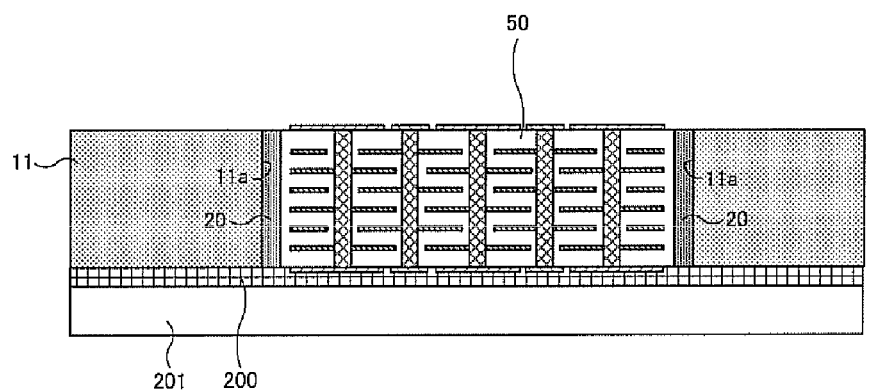
[FIG. 8] Third sectional structural view for explaining the method of manufacturing the wiring substrate of the first embodiment.

Next, as shown in FIG. 7, a separable adhesive tape 200 is applied so as to cover the bottom opening of the accommodation hole 11a. The adhesive tape 200 is supported by a support plate 201. By use of a mounter, the capacitor 50 is accommodated in the accommodation hole 11a and is temporarily fixed through adhesion to the adhesive tape 200. Next, as shown in FIG. 8, the resin filler 20 of a thermosetting resin is charged into the clearance between the wall surface of the accommodation hole 11a and the side surface of the capacitor 50 by use of a dispenser. The applied resin filler 20 is set by a heating process, thereby fixing the capacitor 50 within the accommodation hole 11a.

Figure 9:
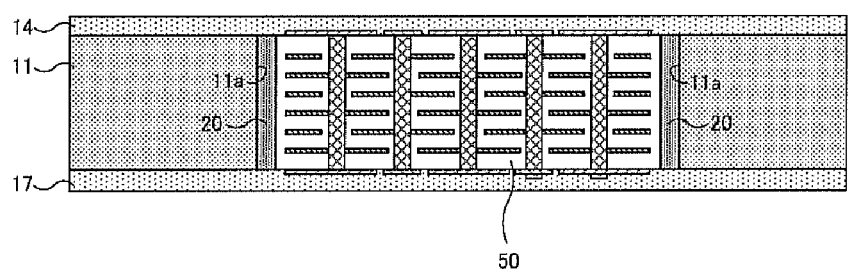
[FIG. 9] Fourth sectional structural view for explaining the method of manufacturing the wiring substrate of the first embodiment.

Next, as shown in FIG. 9, after the capacitor 50 is fixed, the adhesive tape 200 is removed. Subsequently, an adhesive remaining on the lower surface of the core 11 and on the back-surface electrode layer 52 of the capacitor 50 is removed through solvent cleaning and polishing. Also, the surface of the copper plating layer on the front-surface electrode layer 51 of the capacitor 50 is roughened. Next, a film-like insulating resin material which contains epoxy resin as a main component is laminated on each of the upper and lower surfaces of the core 11 and the capacitor 50. Then, the insulating resin material is set through application of heat under compression in a vacuum, thereby forming the resin insulation layer 14 on the upper side, and the resin insulation layer 17 on the lower side.

Figure 10:
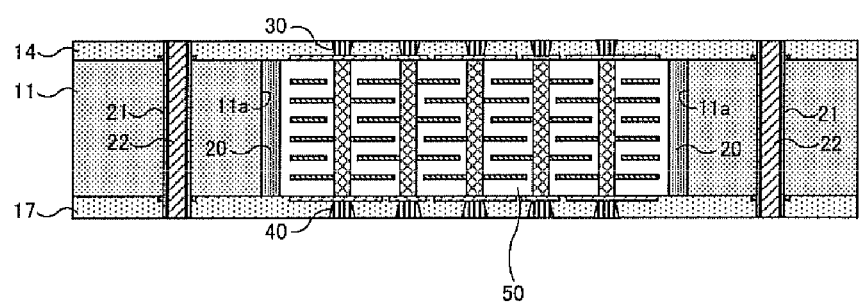
[FIG. 10] Fifth sectional structural view for explaining the method of manufacturing the wiring substrate of the first embodiment.

Next, as shown in FIG. 10, by use of a drilling machine, through holes are drilled in the core 11 at positions where the through-hole conductors 21 are to be formed. Subsequently, electroless copper plating and copper electroplating are performed on the through holes, thereby forming the through-hole conductors 21. A paste which contains epoxy resin as a main component is applied by printing into the cavities of the through-hole conductors 21, followed by setting for forming the blocking bodies 22. Meanwhile, a plurality of via holes are formed, by laser machining, in the resin insulation layers 14 and 17 on the upper and lower sides, respectively, of the core 11 at predetermined positions. The via holes are subjected to desmearing treatment for removing smear from inside the via holes. Subsequently, the via conductors 30 and 40 are formed in the relevant via holes.

Figure 11:
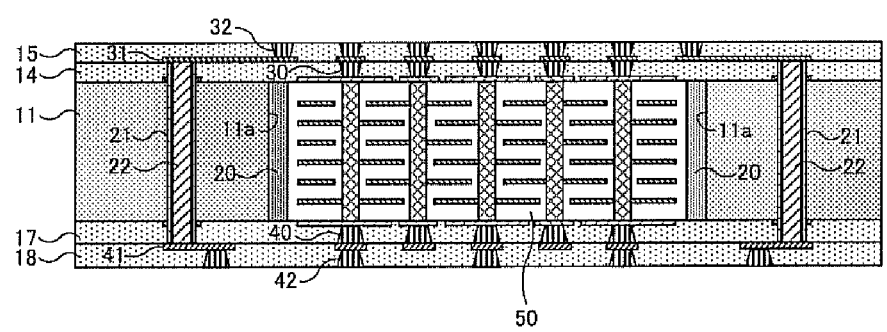
[FIG. 11] Sixth sectional structural view for explaining the method of manufacturing the wiring substrate of the first embodiment.

Next, as shown in FIG. 11, the surfaces of the resin insulation layers 14 and 17 are subjected to patterning, thereby forming the conductor layers 31 and 41, respectively. Next, the above-mentioned film-like insulating resin material is laminated on the upper surface of the resin insulation layer 14 and on the lower surface of the resin insulation layer 17. Then, the insulating resin material is set through application of heat under compression in a vacuum, thereby forming the resin insulation layers 15 and 18. Subsequently, a plurality of the via conductors 32 and 42 are formed in the resin insulation layers 15 and 18, respectively, by a method similar to that for forming the above-mentioned via conductors 30 and 40.

Next, referring back to FIG. 1, a plurality of the terminal pads 33 are formed on the upper side of the resin insulation layer 15, and a plurality of the BGA pads 43 are formed on the lower side of the resin insulation layer 18. Next, a photosensitive epoxy resin is applied to the upper surface of the resin insulation layer 15 and to the lower surface of the resin insulation layer 18 and is then set, thereby forming the solder resist layers 16 and 19. Subsequently, openings are formed in the solder resist layer 16 through patterning, and a plurality of the solder bumps 34 are formed in the respective openings and connected to a plurality of the respective terminal pads 33. Also, openings are formed in the solder resist layer 19 through patterning, and a plurality of the solder balls 44 are formed in the respective openings and connected to a plurality of the respective BGA pads 43. By the procedure described above, the wiring substrate 10 of the first embodiment is completed.

In fabrication of the wiring substrate 10, as described above, the planar structure of the front-surface electrode layer 51 of the capacitor 50 and the planar structure of the conductor layer 31 of the first buildup layer 12 are in the relation shown in FIGS. 3 and 4. In the case where the first buildup layer 12 is to assume a further-multilayered configuration, it is a premise to alternatingly laminate conductor layers having the planar structures of FIGS. 3 and 4, respectively. If all of the conductor layers have a common planar structure (e.g., the planar structure of FIG. 4), the conductor layers have the conductor patterns formed in the same planar position and the clearances formed in the same planar position. Thus, when a pressing force is applied in the direction of lamination, surface irregularities may be generated. By contrast, when the structure of the first embodiment is employed, the conductor patterns alternatingly differ in the planar position of the conductor layer and in the planar position of the clearance, thereby yielding the effect of preventing the generation of surface irregularities mentioned above in the course of manufacture of the wiring substrate 10.

(Second Embodiment)

Next, the wiring substrate 10 of a second embodiment will be described. The basic structures of the wiring substrate 10 and the capacitor 50 are substantially common to the first embodiment of FIGS. 1 to 3 and the second embodiment; thus, the description thereof is omitted. However, the wiring substrate 10 of the second embodiment is greater than that of FIG. 1 in the number of laminates of the first and second buildup layers 12 and 13. This will be described later.

Figure 12:
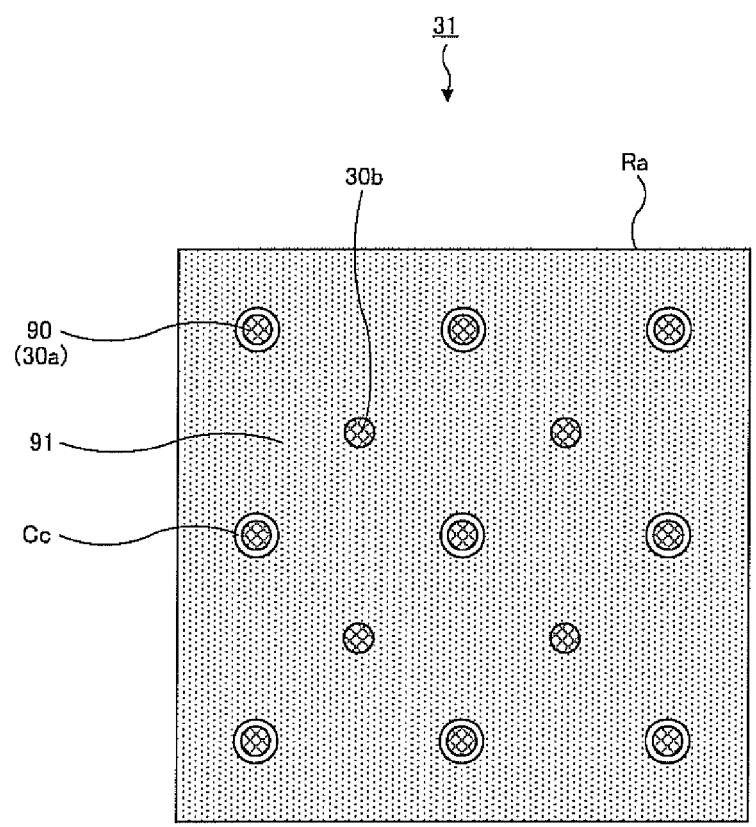
[FIG. 12] View showing an example of the planar structure of the region Ra of the conductor layer 31 of the first buildup layer 12 in a second embodiment, the region Ra facing the front-surface electrode layer 51 of the capacitor 50 with respect to the direction of lamination.
Figure 12:
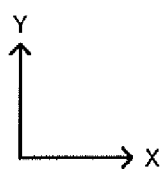

Next will be described the planar structure of the conductor layer 31 (first conductor layer) of the first buildup layer 12 (FIG. 1) of the wiring substrate 10 of the second embodiment, the conductor layer 31 being in proximity to the capacitor 50. FIG. 12 shows an example of the planar structure of the region Ra of the conductor layer 31, the region Ra being in proximity to and facing the front-surface electrode layer 51 of the capacitor 50 with respect to the direction of lamination. The first conductor pattern 90 to be connected to the ground potential, and the second conductor pattern 91 to be connected to the power-supply voltage, are formed in the region Ra of the conductor layer 31. The shape and orientation of the region Ra are common to the first embodiment of FIG. 4 and the second embodiment. The arrangement of the 13 via conductors 30 immediately under the conductor layer 31 is common to FIG. 4 and FIG. 12. However, FIG. 12 differs from FIG. 4 in the arrangements of the first conductor pattern 90 and the second conductor pattern 91.

Specifically, the first conductor pattern 90 is composed of nine independent constituent patterns which are connected to the respective upper ends 30a of nine via conductors 30 and whose arrangement corresponds to that of the via conductors 30. The second conductor pattern 91 is in the form of a solid pattern extending almost over the entire conductor layer 31 and is connected to the upper ends 30b of four via conductors 30. In the region Ra of the conductor layer 31, the second conductor pattern 91 and each of the constituent patterns of the first conductor pattern 90 are insulated from each other by means of a predetermined clearance Cc therebetween.

Figure 13:
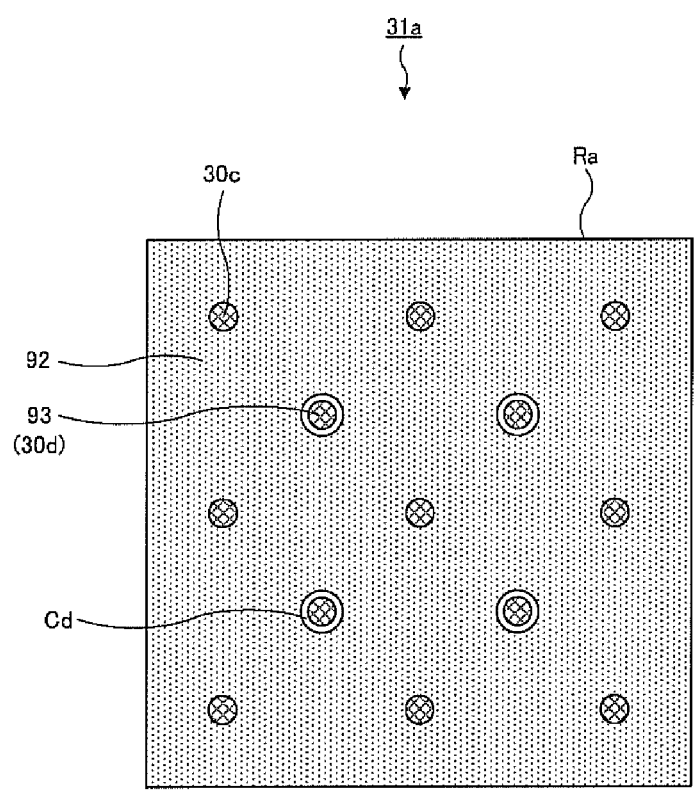
[FIG. 13] View showing an example of the planar structure of the region Ra of a conductor layer 31a of the first buildup layer 12 in the second embodiment, the region Ra being similar to that of the conductor layer 31.

Next will be described the planar structure of a conductor layer 31a (second conductor layer) formed above the conductor layer 31 (first conductor layer) in the first buildup layer 12 (FIG. 1) of the wiring substrate 10 of the second embodiment. Similar to the case of the conductor 31, FIG. 13 shows an example of the planar structure of the region Ra of the conductor layer 31a. Notably, a sectional structure is common to the conductor layer 31a, and the conductor layer 31 of the first buildup layer 12 of FIG. 1. A third conductor pattern 92 to be connected to the ground potential, and a fourth conductor pattern 93 to be connected to the power-supply voltage, are formed in the region Ra of the conductor layer 31a. The arrangement of the 13 via conductors 30 immediately under the conductor layer 31a is common to FIG. 12 and FIG. 13.

As shown in FIG. 13, the third conductor pattern 92 is connected to upper ends 30c of nine via conductors 30 and is in the form of a solid pattern extending almost over the entire conductor layer 31a. Meanwhile, the fourth conductor pattern 93 is composed of four independent constituent patterns which are connected to respective upper ends 30d of four via conductors 30 and whose arrangement corresponds to that of the via conductors 30. In the region Ra of the conductor layer 31a, the third conductor pattern 92 and each of the constituent patterns of the fourth conductor pattern 93 are insulated from each other by means of a predetermined clearance Cd therebetween.

In the structure of the second embodiment, the first electrode pattern 80 (FIG. 3) of the front-surface electrode layer 51 of the capacitor 50, the second conductor pattern 91 of the conductor layer 31, and the third conductor pattern 92 of the conductor layer 31a, in ascending order, are each in the form of a solid pattern. The first electrode pattern 80 and the third conductor pattern 92 are connected to the ground potential, whereas the second conductor pattern 91 is connected to the power-supply voltage. That is, the second embodiment differs from the first embodiment in that a solid pattern to be connected to the ground potential and a solid pattern to be connected to the power-supply voltage are formed alternatingly. The second embodiment also differs from the first embodiment in that each of the first conductor pattern 90 of the conductor layer 31 and the fourth conductor pattern 93 of the conductor layer 31a is composed of a plurality of independent constituent patterns (a plurality of conductor patterns) arranged so as to correspond to the arrangement of via conductors of a via-conductor group.

Figure 14:
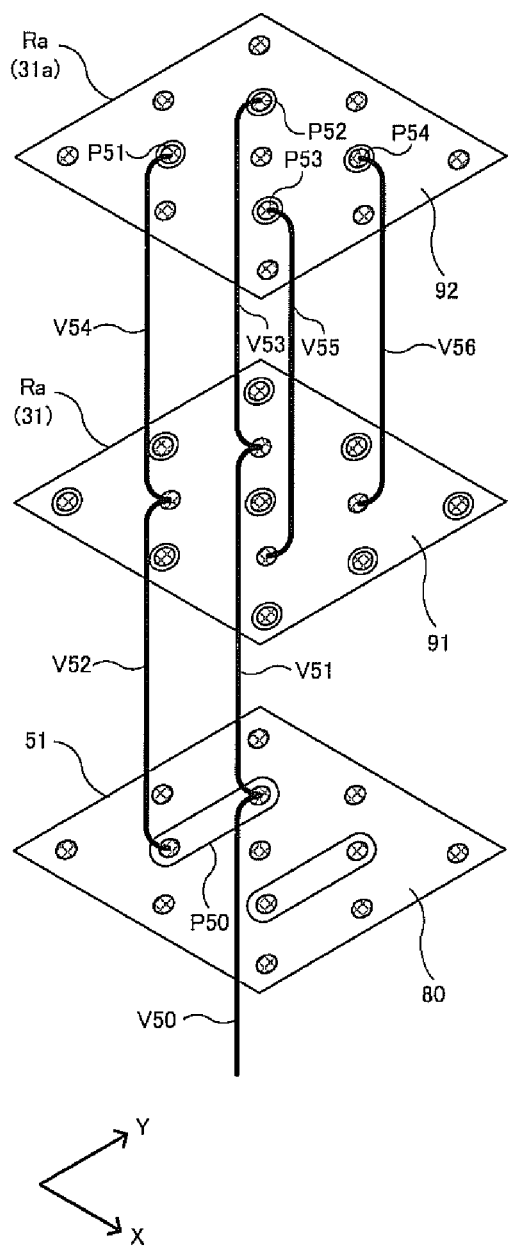
[FIG. 14] View for explaining specific effects of the second embodiment.

Next, specific effects of the second embodiment are described with reference to FIG. 14. Similar to FIG. 5 of the first embodiment, FIG. 14 is a perspective view schematically showing the relation between the electrode patterns 80 and 81 of FIG. 3 and the conductor patterns 90 to 93 of FIGS. 12 and 13. In FIG. 14, the front-surface electrode layer 51 of the capacitor 50, the region Ra of the conductor layer 31, and the region Ra of the conductor layer 31a, in the ascending order, are in such a state as to face each other in the direction of lamination. FIG. 14 focuses on a single via conductor V50 corresponding to one of the via conductors 71 disposed under the front-surface electrode layer 51 of the capacitor 50 and connected to the power-supply voltage. Referring to FIG. 14, electrical connections starting from the via conductor V50 are discussed below.

First, the upper end of the via conductor V50 is connected to the electrode pattern P50 corresponding to one of two columnar patterns of the second electrode pattern 81 and is connected, via the electrode pattern P50, to two via conductors V51 and V52 corresponding to upper via conductors 30. The via conductors V51 and V52 reach the upper conductor layer 31 and are connected, via the solid second conductor pattern 91, to four via conductors V53, V54, V55, and V56 corresponding to the upper via conductors 30. The via conductors V53 to V56 reach the upper conductor layer 31a and are connected to four independent constituent patterns P51, P52, P53, and P54, respectively, of the fourth conductor pattern 93.

As described above, diversified ascending paths exist for the attention-focused single via conductor V50 of the capacitor 50. Although unillustrated in FIG. 14, when attention is focused on one of the via conductors 70 of the capacitor 50, the via conductors 70 being connected to the ground, the via conductor 70 is connected, via the first conductor pattern 90, to nine via conductors 30 in the upper conductor layer 31. In this case also, diversified paths exist. As described above, according to the second embodiment, even when a faulty connection arises in a via-conductor group required for connection to the capacitor 50, connection reliability is enhanced by means of diversified paths, whereby variation of capacitance of the capacitor 50 or a like problem can be prevented. In addition to the effect associated with connection reliability, for example, an effect of enhancing the power supply and an effect of improving the shield effect can be yielded, since, in the second embodiment, a solid conductor pattern is formed for each of the ground potential and the power-supply voltage.

As for a method of manufacturing the wiring substrate 10 of the second embodiment, a method substantially similar to that illustrated in FIGS. 6 to 11 of the first embodiment can be applied. In this case, as mentioned above, the conductor layer 31a must be formed above the conductor layer 31 disposed in proximity to the capacitor 50 by a method similar to that for forming the conductor layer 31.

While the present invention has been specifically described with reference to the first and second embodiments, the present invention is not limited thereto, but may be modified in various other forms without departing from the gist of the invention. For example, in the planar structure of FIG. 3, the second electrode pattern 81 is in the form of columnar patterns connected to the upper ends 71a of four via conductors 71 of a group of via conductors arranged in a staggered manner. However, the first electrode pattern 80 and the second electrode pattern 81 may be formed such that the first electrode pattern 80 connected to the upper ends 70a of nine via conductors 70 is in the form of a plurality of columnar patterns (in the case of the example of FIG. 3, three columnar patterns), whereas the second electrode pattern 81 is in the form of a solid pattern. In this case, the planar structure of FIG. 4 must be formed in compatible relation with that of FIG. 3. In the example of FIGS. 3 and 4, the columnar patterns of the second electrode pattern 81 extend in the X direction, and the columnar patterns of the second conductor pattern 91 extend in the Y direction. However, the extending direction is not limited to the X or Y direction, so long as they extend in respective directions substantially orthogonal to each other. The first and second embodiments are described while referring to the ground potential as the first electric potential and to the power-supply voltage as the second electric potential; however, they may be reversed. Furthermore, the first electric potential and the second electric potential may be set to respectively desired voltages.

The example configuration of the second embodiment shown in FIGS. 12 to 14 is described while referring to the conductor layer 31 disposed above and in proximity to the capacitor 50, and the conductor layer 31a disposed above and adjacent to the conductor layer 31. However, for example, the wiring substrate 10 may have a further multilayered configuration in which the conductor layer 31 of FIG. 12 and the conductor layer 31a of FIG. 13 are alternatingly laminated.

Furthermore, the above embodiments are described while referring to the case of application of the present invention to the capacitor-incorporated wiring substrate in which the capacitor 50 is incorporated. However, a component to be incorporated is not limited to the capacitor 50. The present invention can be applied widely to component-incorporated substrates in which one of various components is incorporated. The structure and material of the wiring substrate 10 and a specific process for manufacturing the wiring substrate 10 are not limited to those of the above embodiments, but may be modified variously.

The present specification claims the benefit of Japanese Patent Application No. 2009-284608, filed Dec. 15, 2009 in Japan, the contents of which are incorporated herein by reference.

Industrial Applicability

As described above, the present invention is applied to a component (capacitor)-incorporated wiring substrate having a core in which a component (capacitor) is incorporated, and a laminate portion in which insulation layers and conductor layers are laminated alternatingly, and is suited for improving connection reliability associated with supply of electric potential.

Description Of Reference Numerals

10: wiring substrate
11: core
11a: accommodation hole
12: first buildup layer
13: second buildup layer
14, 15, 17, 18: resin insulation layer
16, 19: solder resist layer
20: resin filler
21: through-hole conductor
22: blocking body
31, 31a, 41: conductor layer
30, 32, 40, 42: via conductor
33: terminal pad
34: solder bump
43: BGA pad
44: solder ball
50: capacitor
51: front-surface electrode layer
52: back-surface electrode layer
53: ceramic dielectric layer
60, 61: internal electrode layer
70, 71: via conductor
80, 82: first electrode pattern
81, 83: second electrode pattern
90: first conductor pattern
91: second conductor pattern
92: third conductor pattern
93: fourth conductor pattern
100: semiconductor chip
101: pad
200: adhesive tape
201: support plate
Ca, Cb, Cc, Cd: clearance

The invention claimed is:

1. A capacitor-incorporated wiring substrate which has a core having an accommodation portion in the form of a recess or a through hole, a capacitor having dielectric layers and electrode layers laminated alternatingly, and accommodated in the core, and a laminate portion formed on at least an upper surface of the core and having insulation layers and conductor layers laminated alternatingly, comprising:

a first via-conductor group to be electrically connected to a first electric potential, and adapted to connect, in a direction of lamination, the electrode layers and the conductor layers;

a second via-conductor group to be electrically connected to a second electric potential, and adapted to connect, in the direction of lamination, the electrode layers and the conductor layers;

a first electrode pattern formed in a front-surface electrode layer on a front surface of the capacitor and electrically connected to the first via-conductor group;

a plurality of second electrode patterns formed in the front-surface electrode layer and connected to respective columns of via conductors of the second via-conductor group;

a first conductor pattern formed in a proximate conductor layer of the laminate portion disposed in proximity to and facing the capacitor, and electrically connected to the first via-conductor group; and a plurality of second conductor patterns formed in the proximate conductor layer and connected to respective columns of via conductors of the second via-conductor group, wherein each of the second electrode patterns connects a predetermined number of capacitor-side via conductors arranged in a first direction, and each of the second conductor patterns connects a predetermined number of laminate-portion-side via conductors arranged in a second direction intersecting with the first direction.

2. The capacitor-incorporated wiring substrate according to claim 1, wherein the via conductors including those of the first via-conductor group and those of the second via-conductor group are arranged in a grid array or in a staggered array with respect to planar directions.

3. The capacitor-incorporated wiring substrate according to claim 1, wherein each of the second conductor patterns connects the predetermined number of laminate-portion-side via conductors arranged in a second direction orthogonal to the first direction.

4. The capacitor-incorporated wiring substrate according to claim 1, wherein the first electric potential is the ground potential, and the second electric potential is a power-supply voltage.

5. The capacitor-incorporated wiring substrate according to claim 1, wherein the laminate portion includes a conductor layer formed in the same pattern as that of the front-surface electrode layer and a conductor layer formed in the same pattern as that of the proximate conductor layer, the conductor layers being laminated alternatingly above the proximate conductor layer.

6. The capacitor-incorporated wiring substrate according to claim 1, wherein the plurality of the second electrode patterns are patterns of the same elongated rectangular shape arranged in parallel with each other at intervals of the same distance, and the plurality of second conductor patterns are patterns of the same elongated rectangular shape arranged in parallel with each other at intervals of the same distance.

7. The capacitor-incorporated wiring substrate according to claim 1, wherein:

the first electrode pattern is formed in a solid form in the front-surface electrode layer with a predetermined clearance existing between the first electrode pattern and the plurality of the second electrode patterns, and the first conductor pattern is formed in a solid form in the proximate conductor layer with a predetermined clearance existing between the second electrode pattern and the plurality of the second conductor patterns.

8. The capacitor-incorporated wiring substrate according to claim 1, wherein:

the laminate portion allows a semiconductor device greater in planar size than the capacitor to be mounted thereon, and a group of terminals to be connected to the first electric potential and a group of terminals to be connected to the second electric potential are formed on a back surface of the semiconductor device within a region which, as viewed in the direction of lamination, is superimposed on the capacitor.

9. A capacitor-incorporated wiring substrate which has a core having an accommodation portion in the form of a recess or a through hole, a capacitor having dielectric layers and electrode layers laminated alternatingly, and accommodated in the core, and a laminate portion formed on at least an upper surface of the core and having insulation layers and conductor layers laminated alternatingly, comprising:

a first via-conductor group to be electrically connected to a first electric potential, and adapted to connect, in a direction of lamination, the electrode layers and the conductor layers;

a second via-conductor group to be electrically connected to a second electric potential, and adapted to connect, in the direction of lamination, the electrode layers and the conductor layers;

a first electrode pattern formed in a front-surface electrode layer on a front surface of the capacitor and electrically connected to the first via-conductor group;

a plurality of second electrode patterns formed in the front-surface electrode layer and connected to respective subgroups of via conductors of the second via-conductor group, the subgroups each consisting of two or more via conductors;

a plurality of first conductor patterns formed in a first conductor layer of the laminate portion disposed in proximity to and facing the capacitor, and electrically connected to respective via conductors of the first via-conductor group;

a second conductor pattern formed in the first conductor layer and electrically connected to the second via-conductor group;

a third conductor pattern formed in a second conductor layer located above the first conductor layer, and electrically connected to the first via-conductor group; and a plurality of fourth conductor patterns formed in the second conductor layer and electrically connected to respective via conductors of the second via-conductor group, wherein each of the second electrode patterns connects a predetermined number of capacitor-side via conductors.

10. The capacitor-incorporated wiring substrate according to claim 9, wherein:

the second conductor pattern is formed in a solid form with a predetermined clearance existing between the second conductor pattern and the plurality of the first conductor patterns, and the third conductor pattern is formed in a solid form with a predetermined clearance existing between the third conductor pattern and the plurality of the fourth conductor patterns.

11. A component-incorporated wiring substrate which has a plate-like core, a component having an electrode layer formed on at least a front surface thereof, and accommodated in the core, and a laminate portion formed on at least an upper surface of the core and having insulation layers and conductor layers laminated alternatingly, comprising:

a first via-conductor group to be electrically connected to a first electric potential, and adapted to connect, in a direction of lamination, the electrode layer and the conductor layers;

a second via-conductor group to be electrically connected to a second electric potential, and adapted to connect, in the direction of lamination, the electrode layer and the conductor layers;

a first electrode pattern formed in the electrode layer and electrically connected to the first via-conductor group;

a plurality of second electrode patterns formed in the electrode layer and connected to respective columns of via conductors of the second via-conductor group;

a first conductor pattern formed in a proximate conductor layer of the laminate portion disposed in proximity to and facing the component, and electrically connected to the first via-conductor group; and a plurality of second conductor patterns formed in the proximate conductor layer and connected to respective columns of via conductors of the second via-conductor group, wherein each of the second electrode patterns connects a predetermined number of component-side via conductors arranged in a first direction, and each of the second conductor patterns connects a predetermined number of via conductors arranged in a second direction orthogonal to the first direction.

* * * * *